US006867619B2

(12) United States Patent
Hong et al.

(10) Patent No.: US 6,867,619 B2
(45) Date of Patent: Mar. 15, 2005

(54) SHIFT REGISTERS

(75) Inventors: Rui-Guo Hong, Yunlin (TW);
Chih-Chung Chien, Taichung (TW);
Yen-Hua Chen, Taichung (TW);
Shin-Tai Lo, Miaoli (TW)

(73) Assignee: Wintek Corporation, Taichung (TW)

( * ) Notice: Subject to any disclaimer, the term of this patent is extended or adjusted under 35 U.S.C. 154(b) by 79 days.

(21) Appl. No.: 10/453,523

(22) Filed: Jun. 4, 2003

(65) Prior Publication Data

US 2004/0246758 A1 Dec. 9, 2004

(51) Int. Cl.[7] .............................................. H03K 19/096
(52) U.S. Cl. ............................... 326/97; 326/95; 326/96; 326/93
(58) Field of Search ..................................... 326/93–98

(56) References Cited

U.S. PATENT DOCUMENTS 3,610,951 A    10/1971   Howland
3,731,114 A  * 5/1973    Gehweiler ..................... 326/96
3,937,984 A  * 2/1976    Fry ................................. 377/79

* cited by examiner

Primary Examiner—Anh Q. Tran
(74) Attorney, Agent, or Firm—Birch, Stewart, Kolasch & Birch, LLP

(57) ABSTRACT

A shift register includes at least one stage circuit that has at least three voltage control switches, a storage element, and a first clock signal, a second clock signal and a third clock signal to control various switches. Input signals are stored in the capacitor and sequentially transferred to the next stage. During transferring to the next stage, pixel switches of one row on the panel display are activated to receive information delivered from the data end for displaying on the pixels. The clock signals have the characteristics that the first clock signal, second clock signal and third clock signal are not at the same certain potential concurrently to prevent the switches of each stage (the second and third switches) from forming a DC path and burning out.

5 Claims, 13 Drawing Sheets

SHIFT REGISTERS

FIELD OF THE INVENTION

The present invention relates to shift registers and design thereof for simplifying element use number without a complex circuit design to achieve signal time shift functions by adopting well developed low temperature poly-silicon (LTPS) manufacturing processes that form multiple numbers of integrated circuits on a glass substrate to build driver circuits on the display panel and through which to save peripheral IC costs, simplify panel production and improve production yields.

BACKGROUND OF THE INVENTION

The design techniques of shift registers are known in the art. For instance, U.S. Pat. No. 3,610,951 (to Robert, Stamford, el. in 1971) discloses a design shown in FIG. 8. It has six elements formed in a two-stage structure. There are two clock signals clk1 and clk2 of different phases to shift input data by time and deliver through a data output node. FIGS. 9A and 9B illustrate the simulated node waveforms of the art. FIG. 10 shows the clock signal and input/output waveform relationship described in its patent specification. Comparing FIG. 9A with FIG. 10, it indicates that under the same clock signals CLK1 and CLK2 and input signal, the resulting output waveforms are different from those shown in the patent specification (as shown by the circled portions in FIG. 9A). Even using the clock signals shown in FIG. 9B, only a portion of outputs are same (indicated by the left circle for Data-out in FIG. 9B). Based on the simulation on this node, although there is a shift effect for the input signal, whenever the second clock signal (CLK2) has electric potential fluctuation, data output node also changes. Adopting this on the panel display device, the structure does not truly function as shift register. Even if the element is changed to NMOS, the same result occurs. U.S. Pat. No. 3,937,984 (1976) also discloses a similar design as shown in FIG. 11. It has a capacitor C with one terminal connecting to an output node B of this stage. The gate of the MOS with one terminal connecting to output node B is connected to a reference voltage Vd1 which maintains a low (or high) level voltage when the output node does not have signal output on this stage. Taking PMOS as an example, Vd1 must be a low potential to maintain the output at a high level voltage at the non-trigger signal condition. If Vd1 potential were too low, as the source node of the PMOS is connected to the positive voltage Vdd, output signal cannot reach the desired low potential. As shown in FIG. 12 (indicated by a solid circle), in the event that Vd1 potential is not lower enough, while the output signal can reach a lower level, it is easy to be interfered by the clock signals as shown in FIG. 12 (indicated by circles broken lines). Hence another clock signal has to be used to replace the reference potential Vd1 to improve the problem.

SUMMARY OF THE INVENTION

Therefore the primary object of the invention is to resolve the aforesaid disadvantages. The invention aims at simplifying element usage number to achieve same circuit functions without a complex circuit design.

In order to achieve the foregoing object, the shift register of the invention includes at least switches controlled by a first, a second and a third clock signals. Input signals are stored in capacitors and transferred sequentially to the next stage, and during transfer to the next stage, pixel switches of one row on the panel display are turned on to receive information delivered from the data node for displaying on the pixels. The clock signals have characteristics that the first, second and third clock signal cannot be at the low potential at the same time to prevent the switches (second and third switches) of every stage from forming a DC path and burning out.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
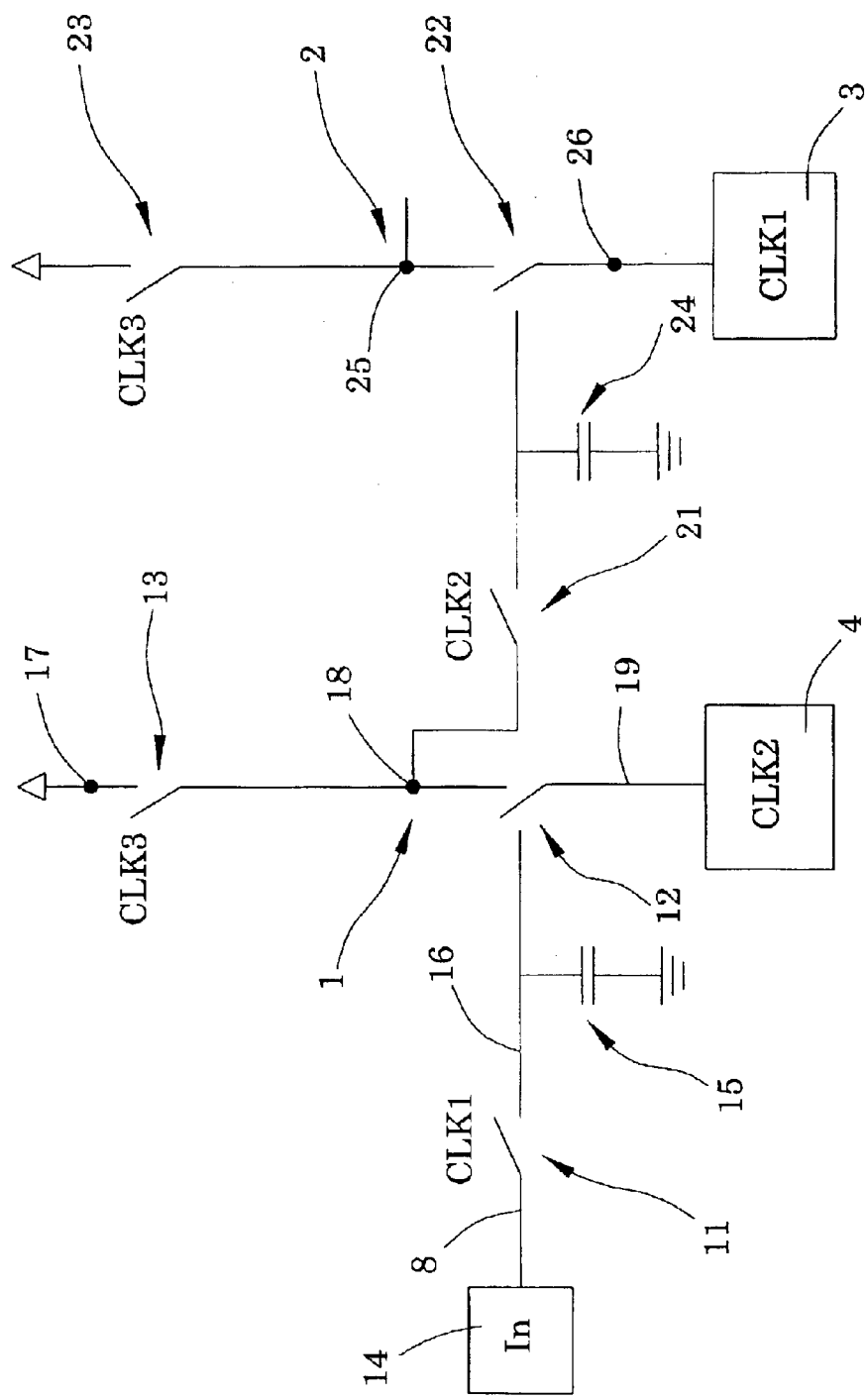
FIG. 1 is a schematic circuit diagram of the first and the second stage circuit of the shift register according to the invention.
Figure 2:
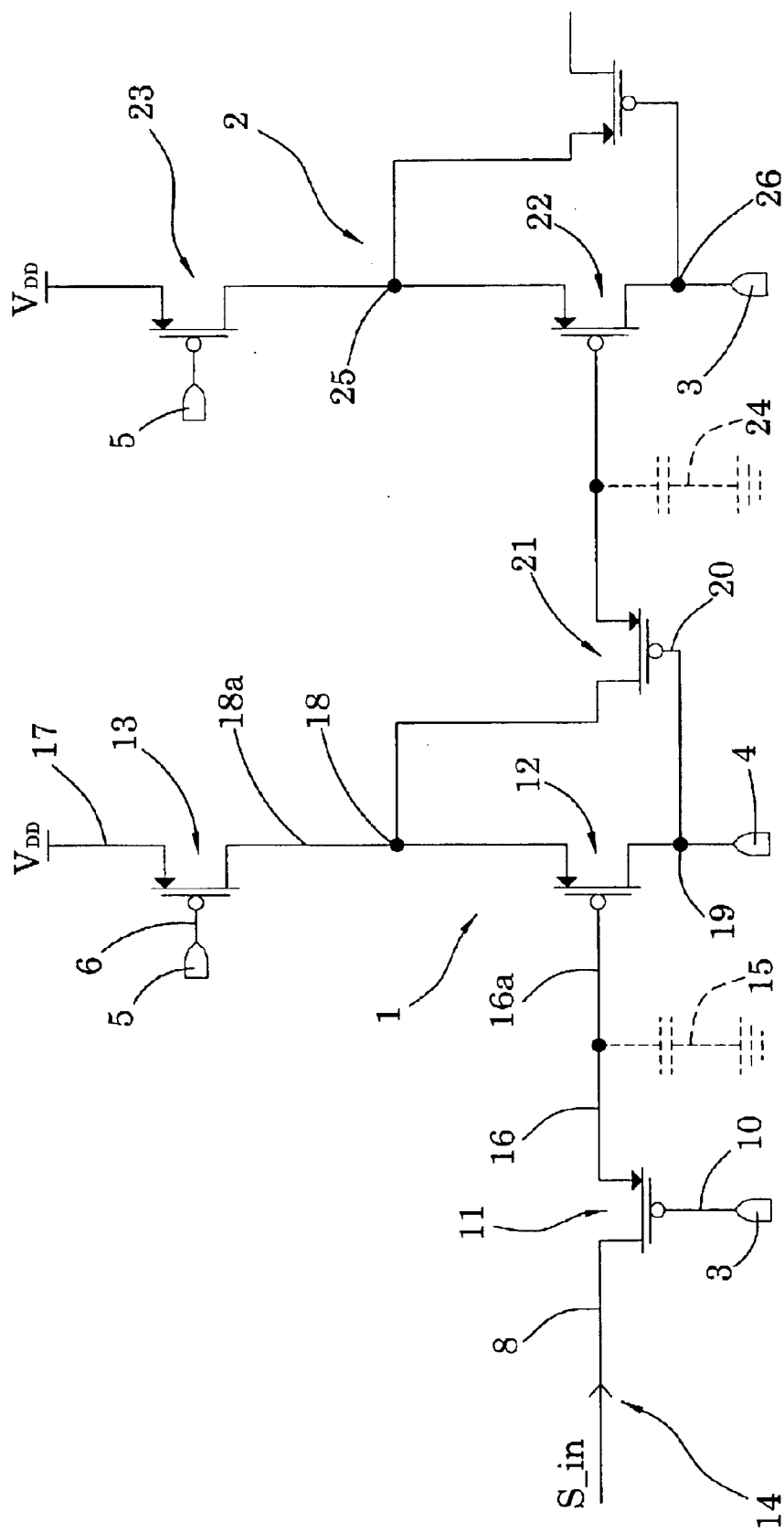
FIG. 2 is an actual circuit diagram according to FIG. 1.
Figure 3A:
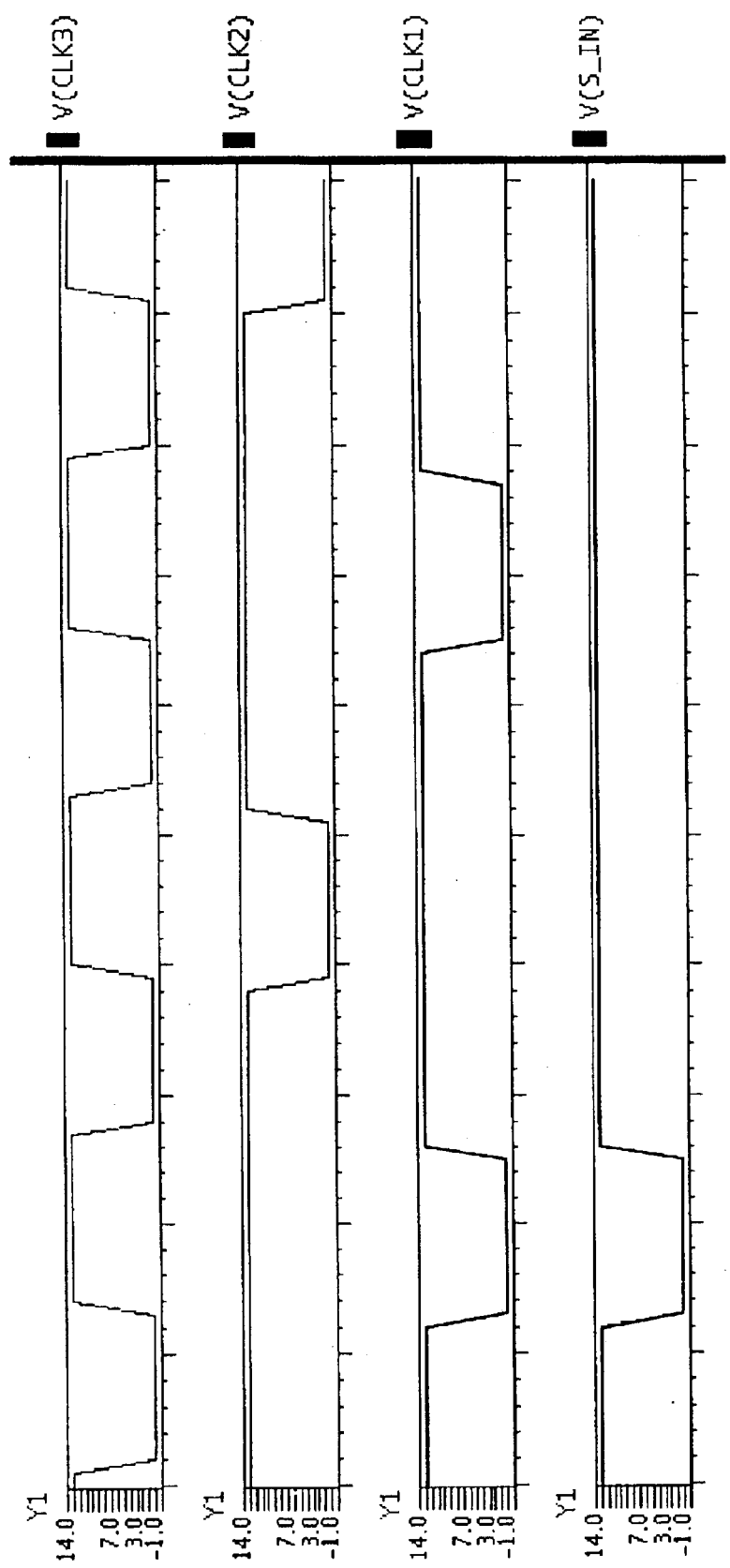
FIG. 3A is a schematic chart showing the timing of clock and input signals of the invention.
Figure 3B:
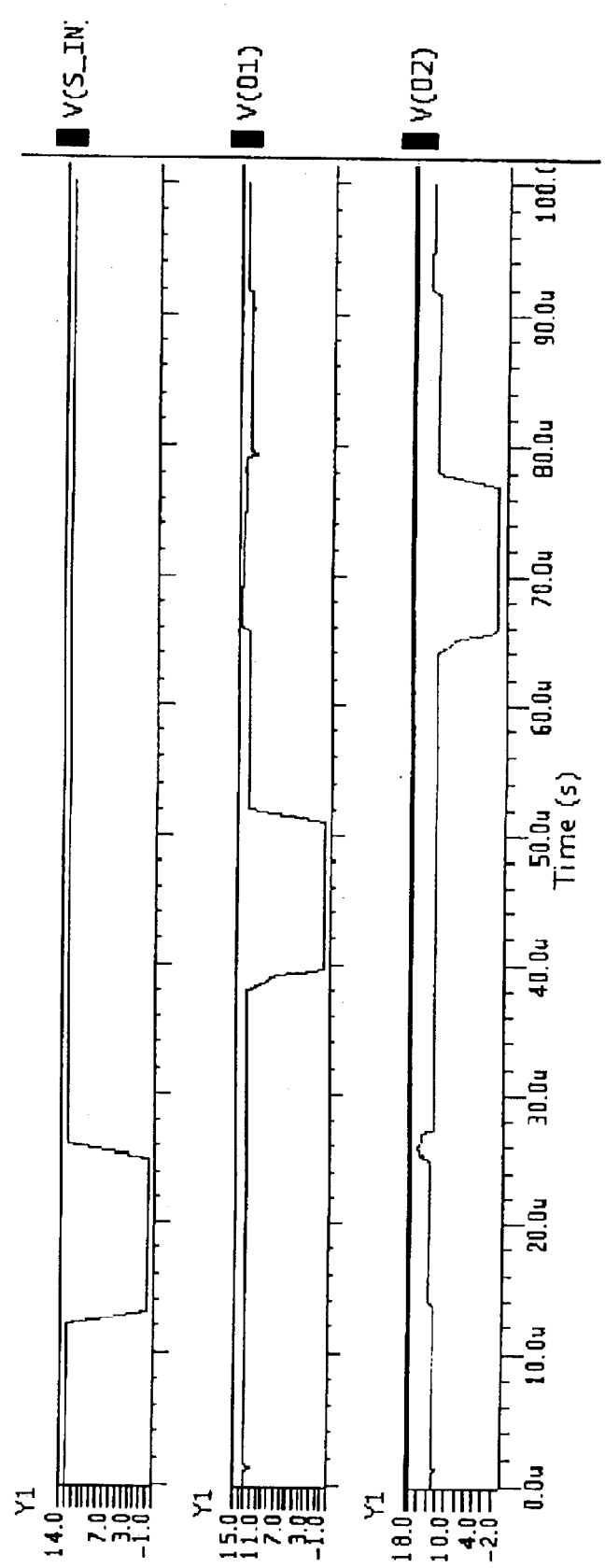
FIG. 3B is a schematic chart showing the input signal and the first and the second stage output signals of the invention.

Refer to FIGS. 1 and 2 having a first and second stage shift register and the circuit diagram according to FIG. 1. The design may be adapted for shift registers of any stages desired. The shift register of the invention includes at least a first stage circuit 1 to receive input signals for time shift and deliver signals to a next stage. The first stage circuit 1 has an input node 14 equipped with a first switch 11. The switch 11 has an output node 16 to serve a control node 16 of switch 12. The output node 16 of switch 11 also connects to one terminal of a capacitor 15 for storing input signals of the first stage circuit 1. The switch 12 has an output node 18 connecting to an output node 18 of a switch 13 to serve as the node of the signal output node 18 of this stage. The input node 8 of the switch 11 receives an input signal 14. The control node 10 of the switch 11 has a clock signal (CK1) 3. The switch 12 has another input node 19 which has a clock signal (CLK2) 4. The switch 13 has a control node 6 which has a clock signal (CLK3) 5.

The switch 13 has another input node 17 connecting to a constant power supply. The second stage circuit 2 is a replication of the first stage circuit 1. However, the clock signal (CLK1) 3 is connected to an input node 26 of a switch 22, and the clock signal (CLK2) 4 is connected to a control node 20 of a switch 21 of this stage.

The switches set forth above are MOS (PMOS, NMOS, CMOS) elements to mate with suitable clock signals to transfer input signals.

Refer to FIGS. 1, 2, 3A and 3B for a two-stage output shift register and the actual circuit diagram according to FIG. 1, and input signals and clock signals 3, 4 and 5. The switches in the figures are PMOS for examples. Combing clock signal (CLK1) 3, (CLK2) 4 and (CLK3) 5 form a two-stage shift register circuit. The circuits of the later stages have the same circuit structure. The only difference is that the nodes connected to (CLK1) 3 and (CLK2) 4 at each stage are switched to each other for the next stage. That is (CLK1) 3 connected to control node 10, (CLK2) 4 connected to input node 19 at this stage. (CLK1) 3 connected to node 26, (CLK2) 4 connected to node 20 is the next stage to achieve input signal shifting effect.

In addition, there is a parasite capacitance between the gate and the source or drain of the MOS element. If the capacitance is large enough to store input signals, the external storage elements 15 and 24 may be omitted. FIG. 2 shows an example with the storage elements 15 and 24 omitted. Operation of the PMOS shift register circuit is as follows: when input signal (S_IN) 14 is a low potential (LOW), the (CLK1) 3 controlling the first switch 11 should complete low potential (LOW), high potential (HIGH) operations before the input signal (S_IN) 14 is transformed to the high potential (HIGH) so that the input signals (S_IN) 14 may flow through the switch 11 and stay in the storage element 15, and make the control node 16 of the switch 12 at a low potential to form an ON state. Before CLK1 making the switch 11 ON, the node 10 and node 26 are at high potential (HIGH), the low potential (LOW) of the clock 1 signal (CLK3) 5 makes the switch 13 and the switch 23 to become ON state, and the output node of the first stage 18 and second stage 25 maintains at a high potential (HIGH) close to the voltage Vdd of node 17. The high potential (HIGH) of the nodes 18, 25 and node 26 makes the switch 22 to become in OFF statemaking the output node 25 of second stage maintaining original potential (not affected by fluctuation of CLK1)while CLK1 signal is at a low potential. When the second clock signal (CLK2) 4 has high, low and high potential fluctuations (HIGH, LOW, HIGH), due to the switch 12 is ON, and the clock signal (CLK3) 5 is at high potential (CLK3 HIGH), the first stage output node 18 synchronously generates high, low and high potential fluctuations to complete signal shift operation of the first stage circuit 1.

The control clock signal has characteristics as follows: the clock signal (CLK1) 3, (CLK2) 4 and (CLK3) 5 are not at the low potential at the same time to prevent the switch 12 and the switch 13 from forming a DC path and burning out. When the input signal (S_IN) 14 is at the high potential (HIGH), the switch 12 is OFF and the second clock signal (CLK2) 4 does not appear on the node of the stage output node 18. Operations of the later stages repeat those set forth above.

Figure 4:
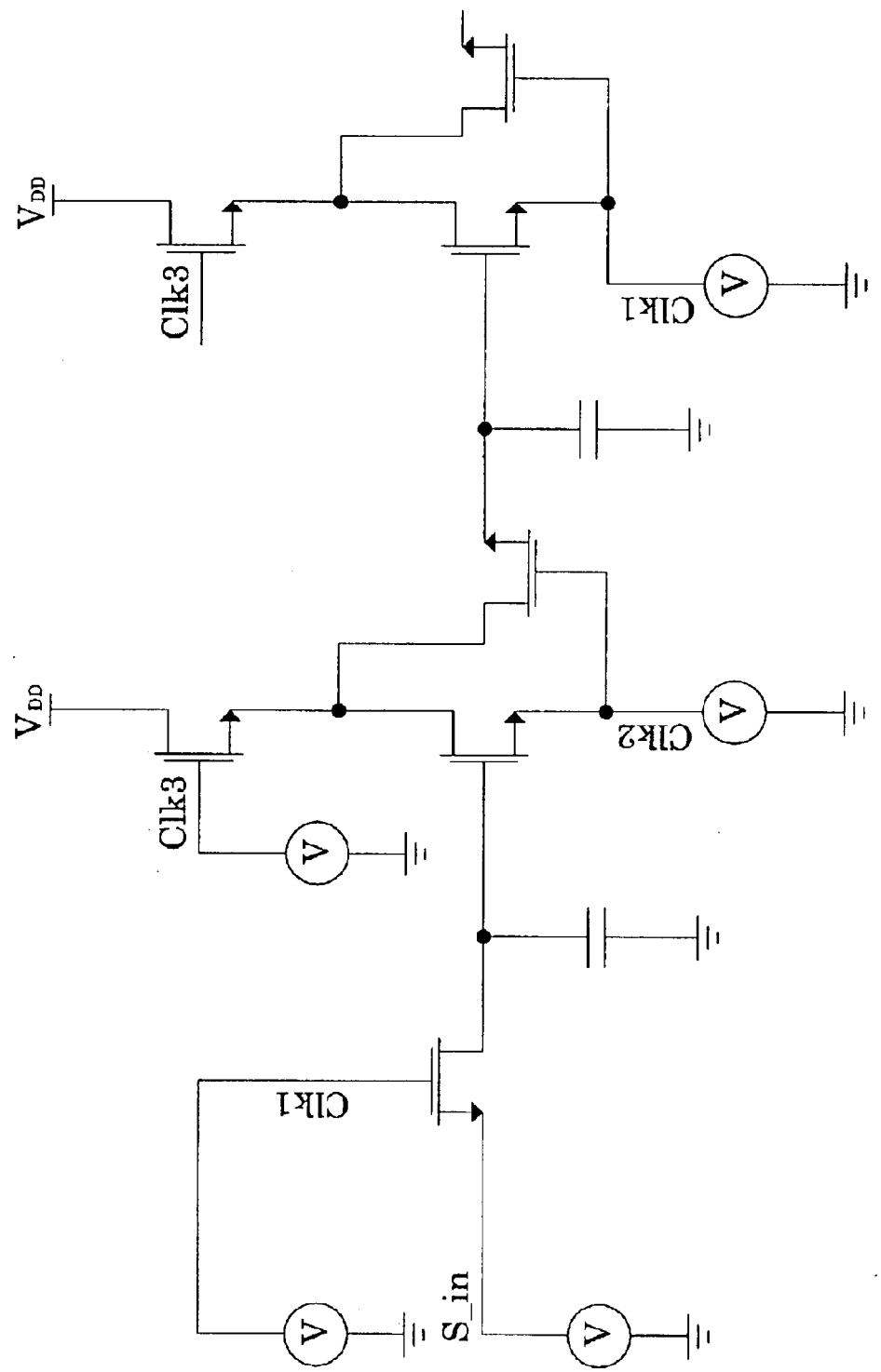
FIG. 4 is a circuit diagram of another embodiment of the invention.
Figure 5:
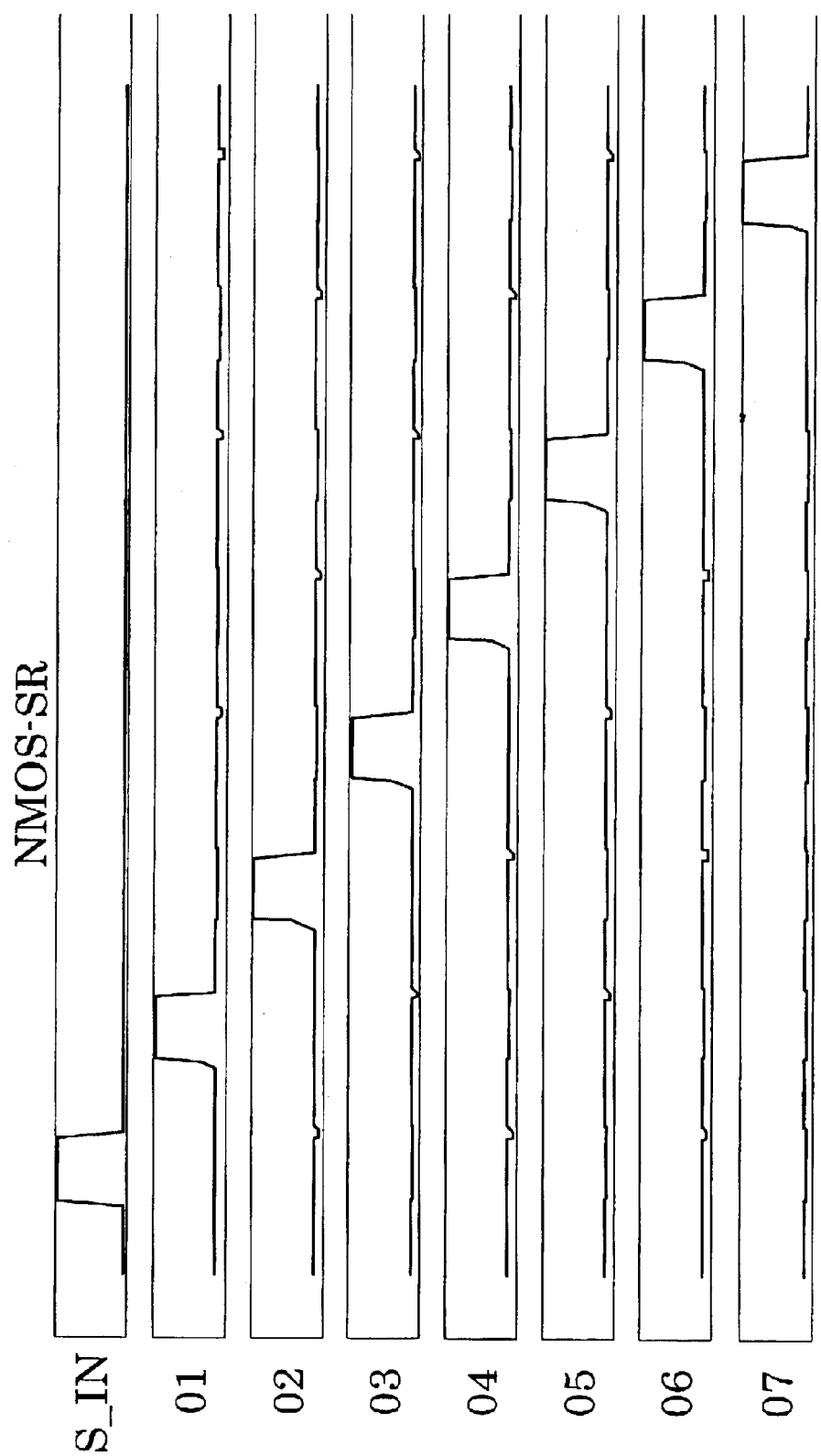
FIG. 5 is a schematic chart showing the input signal and the output waveforms of the first through the seventh stage according to the circuit shown in FIG. 4.

Refer to FIGS. 4 and 5 for another embodiment of the invention showing the input and output waveforms of the first stage through the seventh stage. It substantially likes the one shown in FIGS. 1 and 2. The difference is that every switch uses NMOS as switch (or transmission gate). The control principle is same as that shown in FIGS. 1 and 2, details are omitted.

Figure 6:
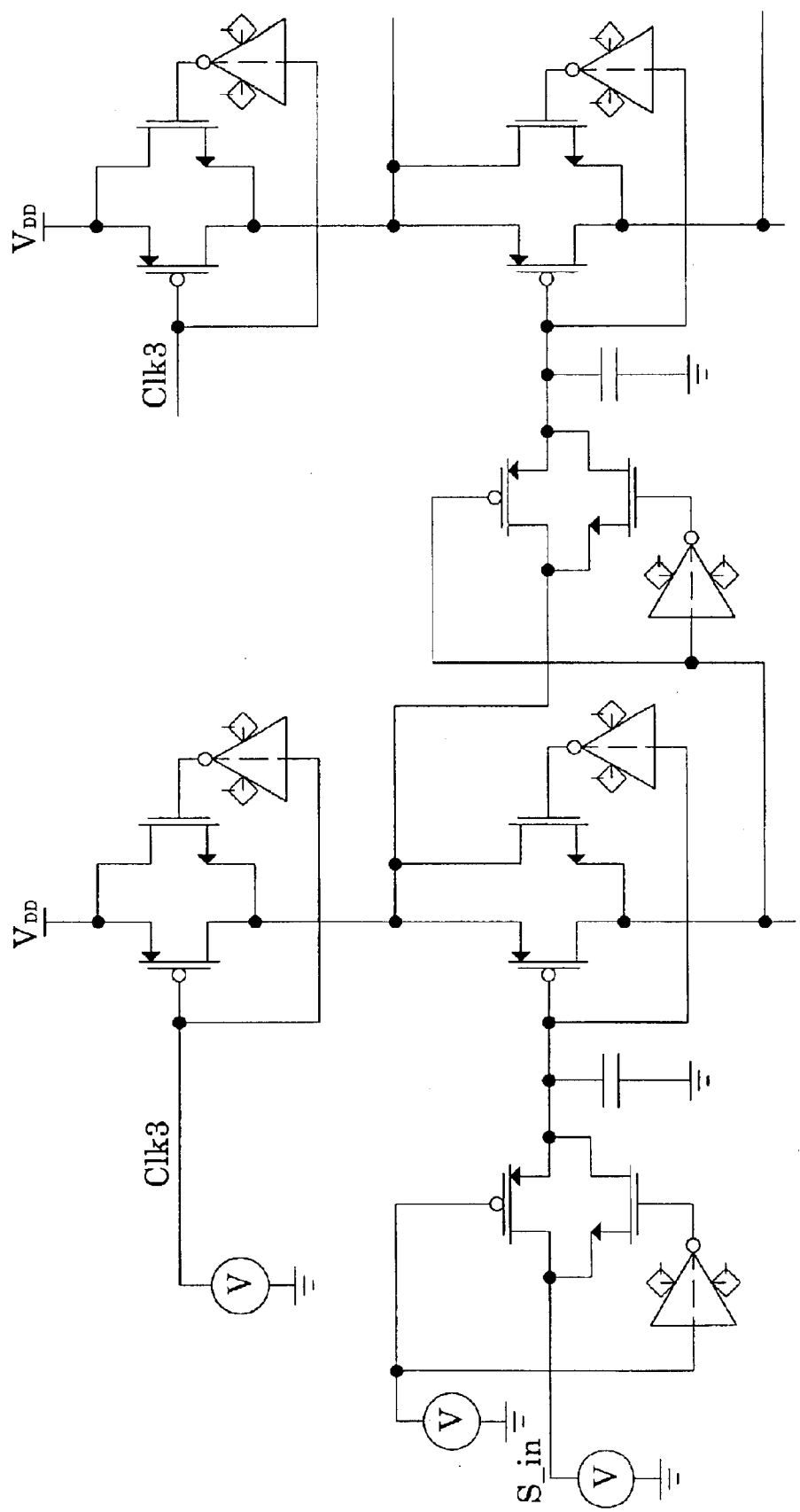
FIG. 6 is a circuit diagram of yet another embodiment of the invention.
Figure 7:
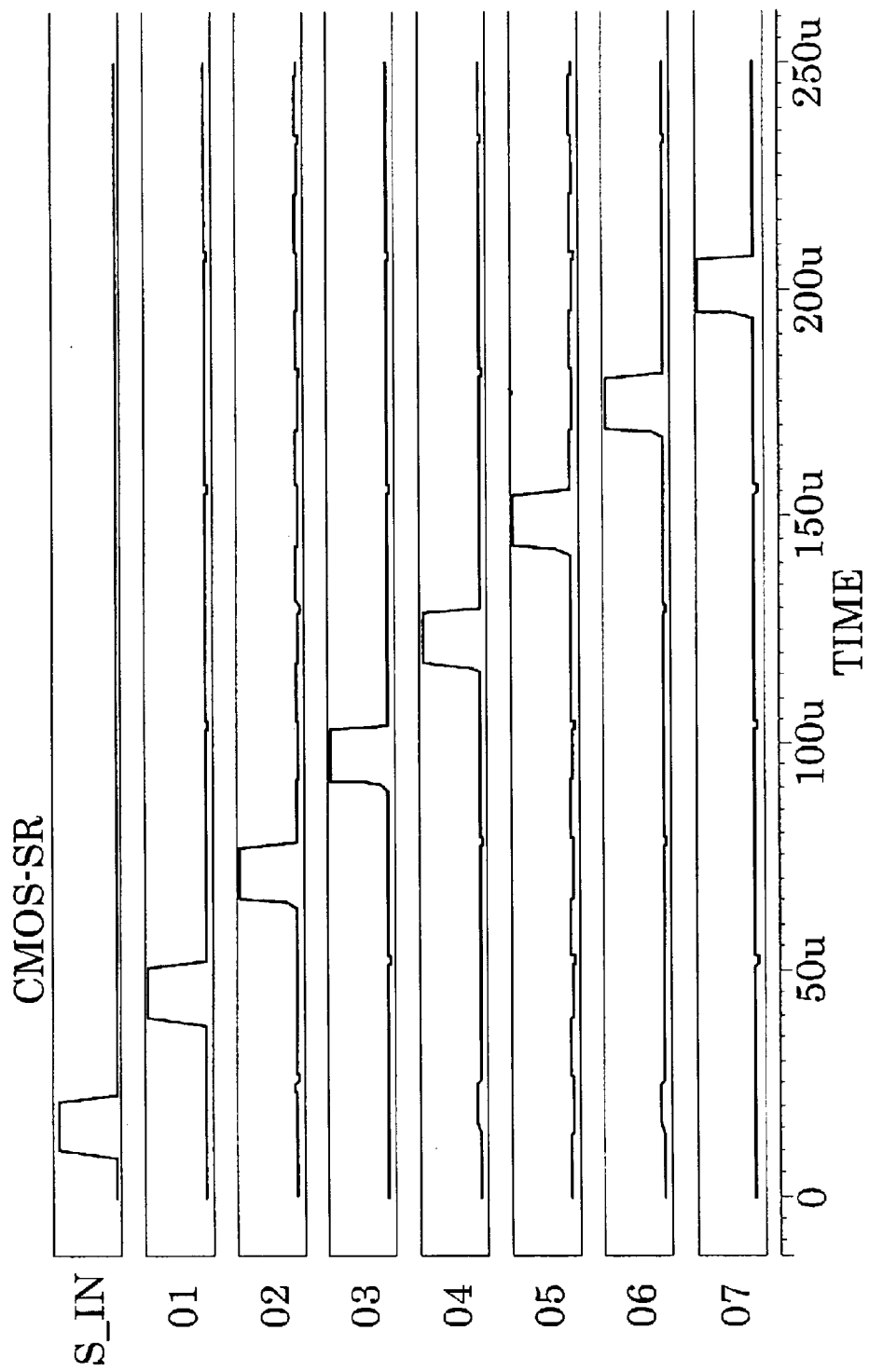
FIG. 7 is a schematic chart showing the input signal and the output waveforms of the first through the seventh stage according to the circuit shown in FIG. 6.
Figure 8:
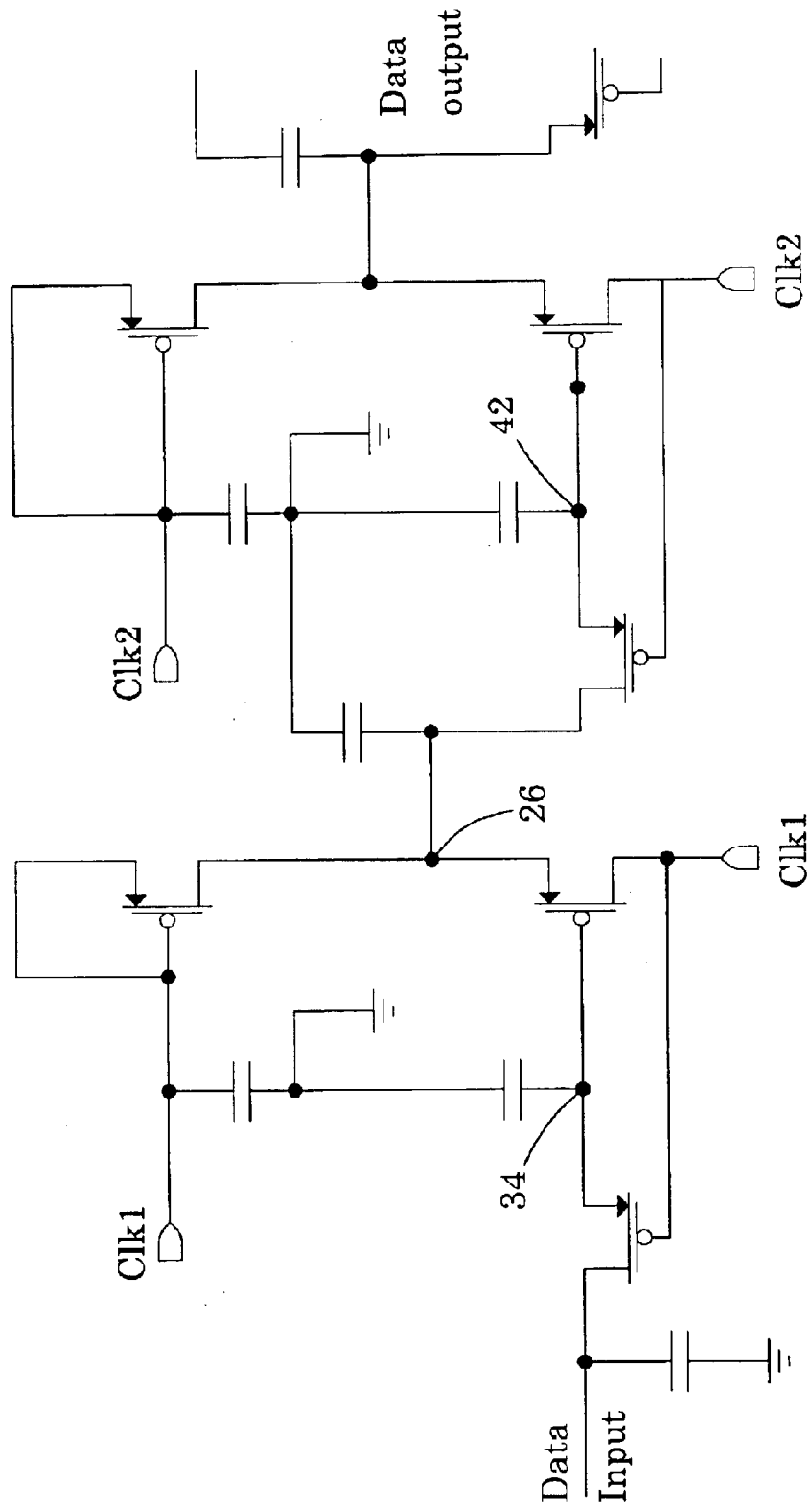
FIG. 8 is a circuit diagram of a conventional two-stage shift circuit.
Figure 9A:
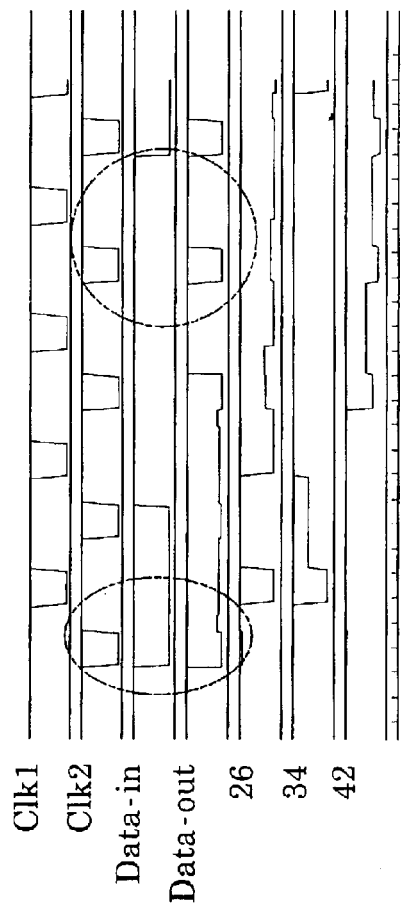
FIGS. 9A and 9B are schematic charts showing the simulated node waveforms according to FIG. 8.
Figure 9B:
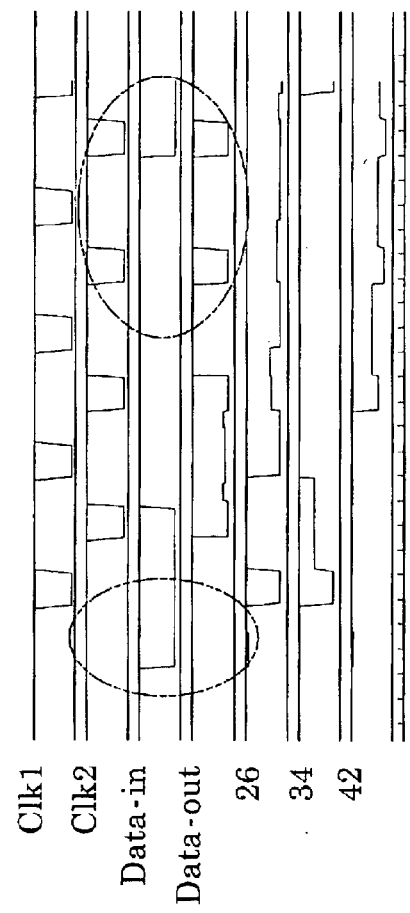
Figure 10:
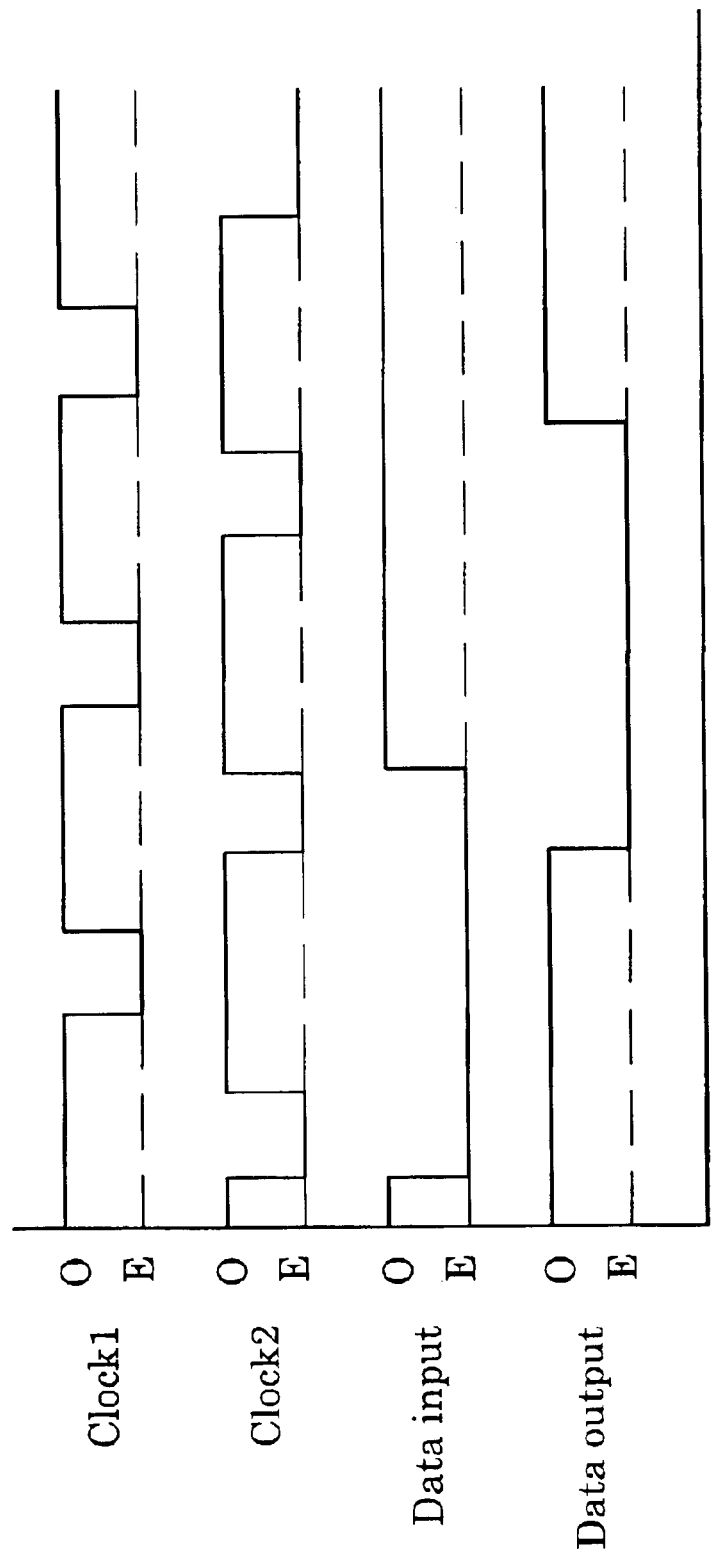
FIG. 10 is a schematic chart showing the node waveforms obtained from the prior art according to FIG. 8.
Figure 11:
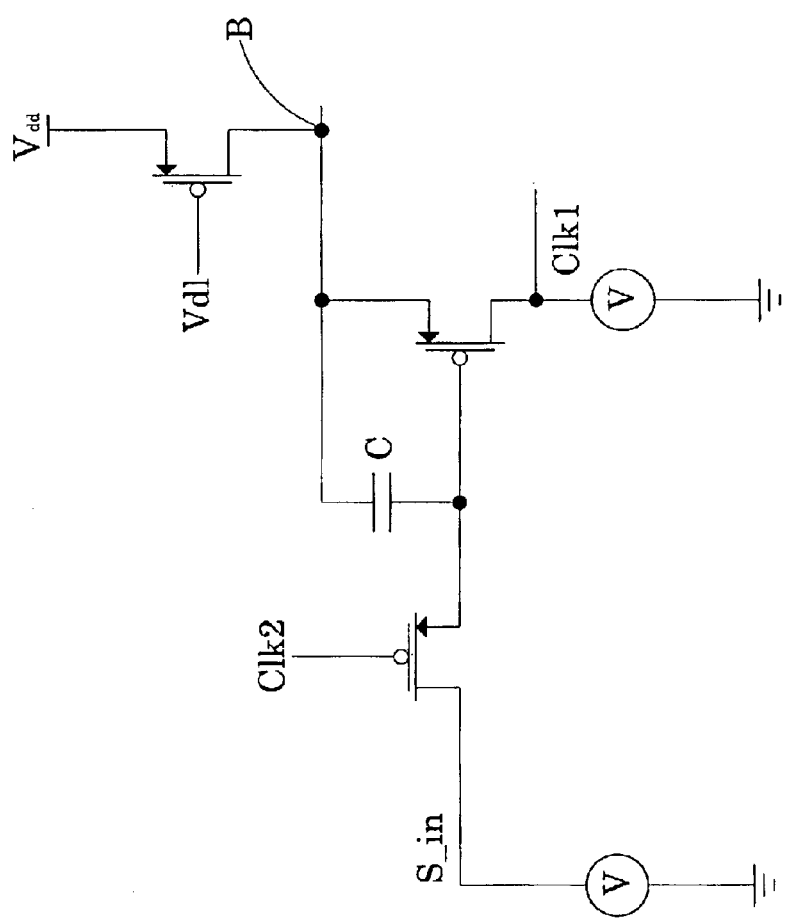
FIG. 11 is a circuit diagram of conventional shift circuit.
Figure 12:
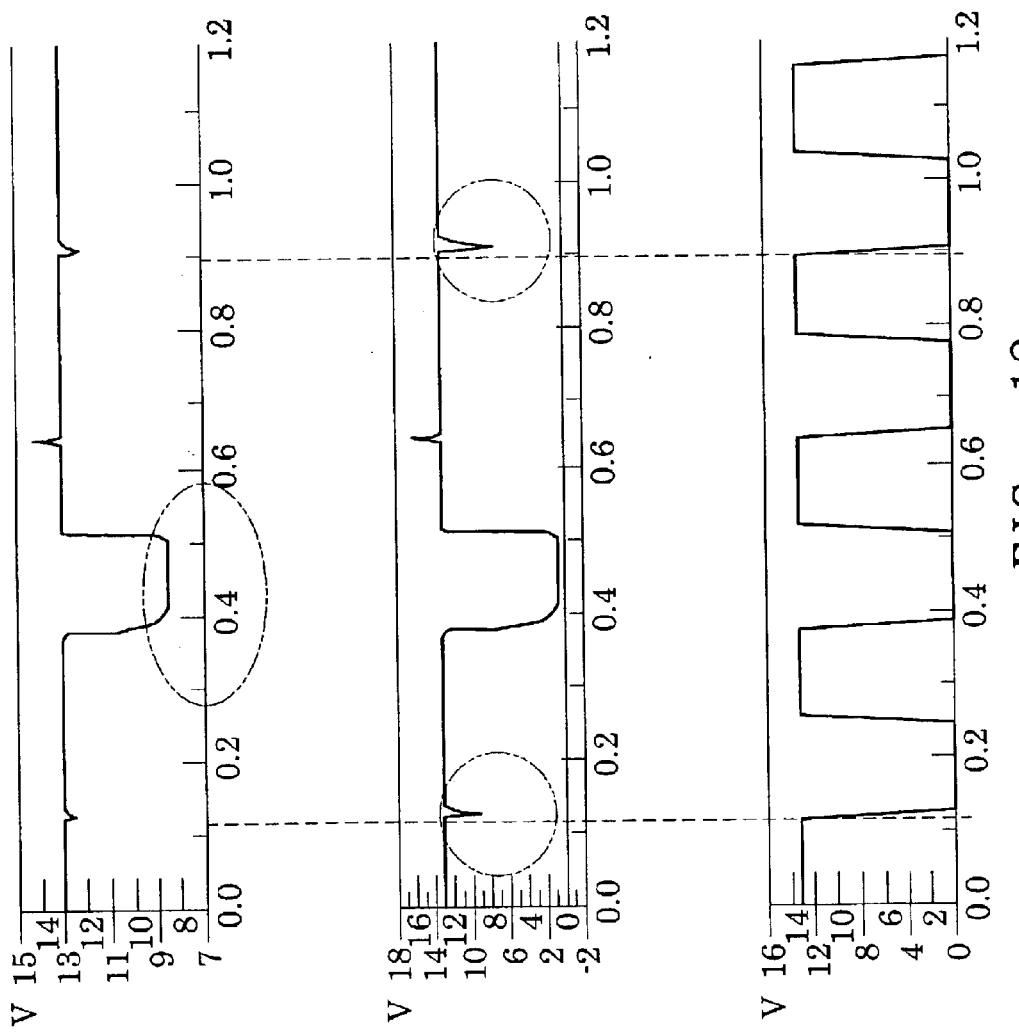
FIG. 12 is a schematic chart showing the node waveforms according to FIG. 11.

Refer to FIGS. 6 and 7 for yet another embodiment of the invention showing the input and output waveforms of the first stage through the seventh stage. It substantially likes the one shown in FIGS. 1 and 2. The difference is that every switch uses CMOS as switch (or transmission gate). The control principle is same as that shown in FIGS. 1 and 2, details are omitted.

In addition, the invention can achieve an improved signal output level and a lower clock pulse interference, and can correctly perform time shift for input signals.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A shift registercomprising:
    a first switch having input node, control node and an output node connecting to a control node of a second switch and one terminal of a storage element, the second switch having an output node connecting to an output node of a third switch to form a first stage circuit and an output node thereof;
    an input signal generated on the input node of the first switch and a first clock signal generated on the control node, the second switch having another input node receiving a second clock signal, the third switch having a control node receiving a third clock signal; and
    a fourth switch connecting to the output node of the first stage circuit, the fourth switch having an output node connecting to a control node of a fifth switch and one terminal of a second storage element, the fifth switch having an output node connecting to an output node of a sixth switch to form a output node of the second stage circuit; the fifth switch having another input node receiving the first clock signal, and the sixth switch having a control node receiving the third clock signal;
    wherein the first stage circuit and the second stage circuit are controlled by the first clock signal, the second clock signal, and the third clock signal to achieve shift transfer of the input signal.

2. The shift register of claim 1, wherein the switches are MOS elements.

3. The shift register of claim 2, wherein the MOS elements are selected from the group consisting of PMOS, NMOS and CMOS.

4. The shift register of claim 1, wherein the first clock signal, the second clock signal and the third clock signal are not low potential concurrently for PMOS, not high potential concurrently for NMOS and CMOS, to prevent the second switch and the third switch from forming a DC path and burning out.

5. The shift register of claim 1, wherein the first storage element and the second storage element are capacitors.

* * * * *